US009595450B2

United States Patent
Tu et al.

(10) Patent No.: US 9,595,450 B2
(45) Date of Patent: Mar. 14, 2017

(54) COMPOSITE STRUCTURE FOR GATE LEVEL INTER-LAYER DIELECTRIC

(71) Applicant: Taiwan Semiconductor Manufacturing Co., Ltd., Hsin-Chu (TW)

(72) Inventors: Che-Hao Tu, Hsinchu (TW); William Weilun Hong, Hsinchu (TW); Ying-Tsung Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 59 days.

(21) Appl. No.: 14/141,028

(22) Filed: Dec. 26, 2013

(65) Prior Publication Data

US 2015/0187594 A1  Jul. 2, 2015

(51) Int. Cl.
  *H01L 27/088* (2006.01)
  *H01L 21/3105* (2006.01)
  *H01L 27/092* (2006.01)
  *H01L 29/66* (2006.01)
  *H01L 21/8234* (2006.01)

(52) U.S. Cl.
  CPC ........... *H01L 21/31055* (2013.01); *H01L 21/823462* (2013.01); *H01L 21/823481* (2013.01); *H01L 27/088* (2013.01); *H01L 27/092* (2013.01); *H01L 27/0928* (2013.01); *H01L 29/66545* (2013.01)

(58) Field of Classification Search
  CPC ............. H01L 21/31055; H01L 27/092; H01L 27/0928
  USPC ......... 257/371, 372, 392, E27.029, E27.062, 257/E27.067
  See application file for complete search history.

(56) References Cited

U.S. PATENT DOCUMENTS

| 6,303,418 | B1 * | 10/2001 | Cha ................ H01L 21/823842 257/E21.637 |
| 8,298,894 | B2 * | 10/2012 | Lenski et al. ................ 438/275 |
| 2010/0087055 | A1 * | 4/2010 | Lai et al. ...................... 438/585 |
| 2013/0105903 | A1 * | 5/2013 | Chang et al. ................. 257/369 |

* cited by examiner

*Primary Examiner* — Robert Huber
(74) *Attorney, Agent, or Firm* — Eschweiler & Associates, LLC

(57) ABSTRACT

A method of forming an integrated circuit device includes forming dummy gates over a semiconductor substrate, depositing a first dielectric layer over the dummy gates, chemical mechanical polishing to recede the first dielectric layer to the height of the dummy gates, etching to recess the first dielectric layer below the height of the gates, depositing one or more additional dielectric layers over the first dielectric layer, and chemical mechanical polishing to recede the one or more additional dielectric layers to the height of the gates. The method provides integrated circuit devices having metal gate electrodes and an inter-level dielectric at the gate level that includes a capping layer. The capping layer resists etching and preserves the gate height through a replacement gate process.

19 Claims, 7 Drawing Sheets

COMPOSITE STRUCTURE FOR GATE LEVEL INTER-LAYER DIELECTRIC

FIELD

The present disclosure relates to integrated circuit devices and a gate-last process for producing integrated circuit devices with high-k dielectrics and metal gates.

BACKGROUND

In an effort to increase device densities, many years of research have been devoted to reducing critical dimensions (CDs) in integrated circuit devices. Research has resulted in a long felt need to replace traditional gate structures with gates having high-k dielectrics and metal electrodes. High-k dielectrics can provide enhanced capacitance in comparison to an equivalent thickness of silicon dioxide. A metal electrode with suitable work function is desirable to avoid charge carrier depletion proximate the electrode interface with the high-k dielectric. The electrodes for p-channel and n-channel transistors may require different metals to provide suitable work functions.

Suitable metals for gate electrodes can be adversely affected by processing used to form source and drain regions. In particular, annealing to repair source and drain implant damage can shift the work function of electrode metals. This has led to various new manufacturing processes, including replacement gate (gate-last) processes. In a replacement gate process, a gate stack is formed with polysilicon in place of the electrode metal. After source and drain regions are formed, the polysilicon is removed to form trenches which are then filled with the desired electrode metals.

DETAILED DESCRIPTION

It has been observed that gate height may be unintentionally reduced through the dummy gate removal process and that this can have an adverse effect on device performance. The present disclosure solves this problem by forming the inter-level dielectric at the gate level (ILD0) to be a composite of two or more layers, with the upper layer having a higher resistance to the etch process used for dummy gate removal. The composite ILD0 better maintains gate height through the gate replacement process and provides integrated circuit devices having metal gates with a more easily predetermined and consistent height.

Figure 1:
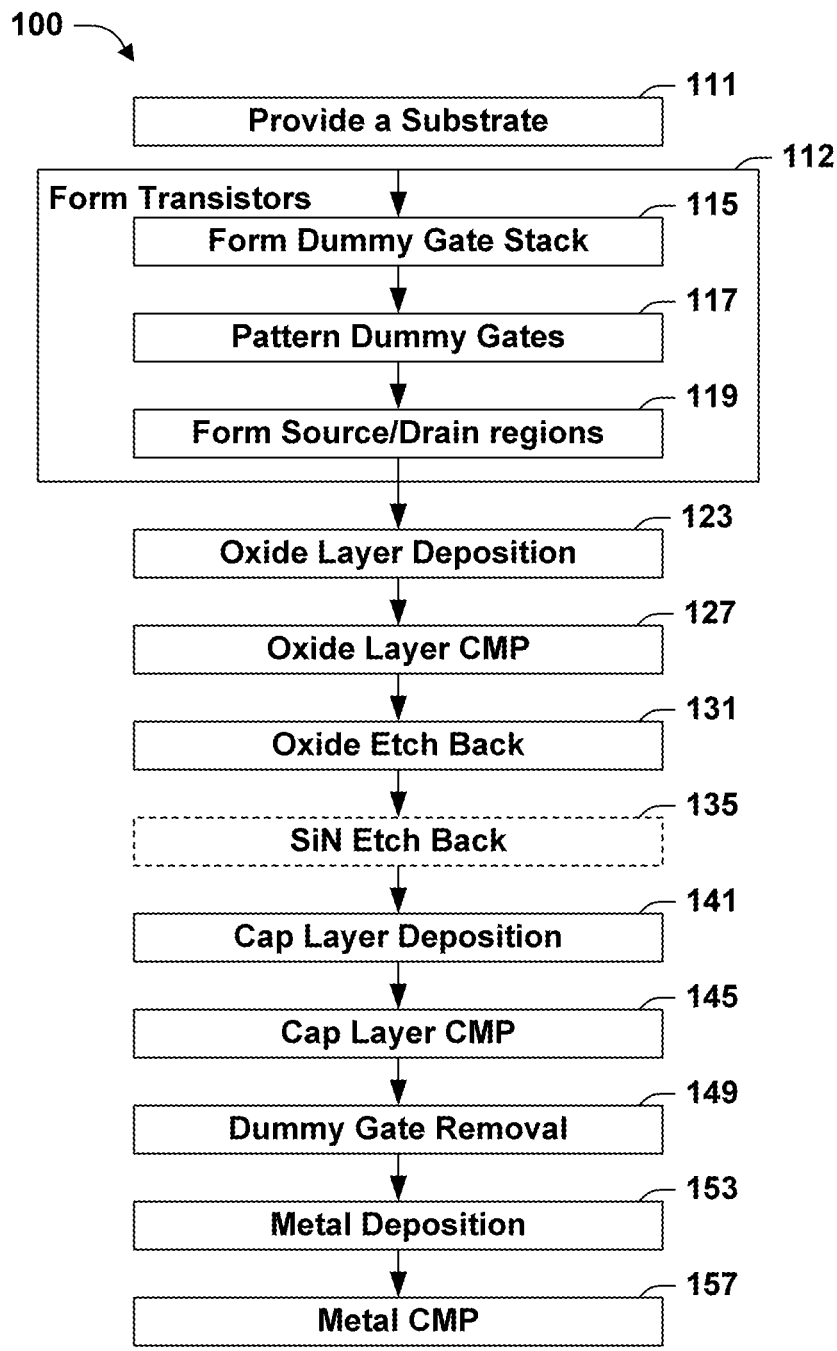
FIG. 1 is a flow chart of a process that is an example of one embodiment provided by the present disclosure.
Figure 12:
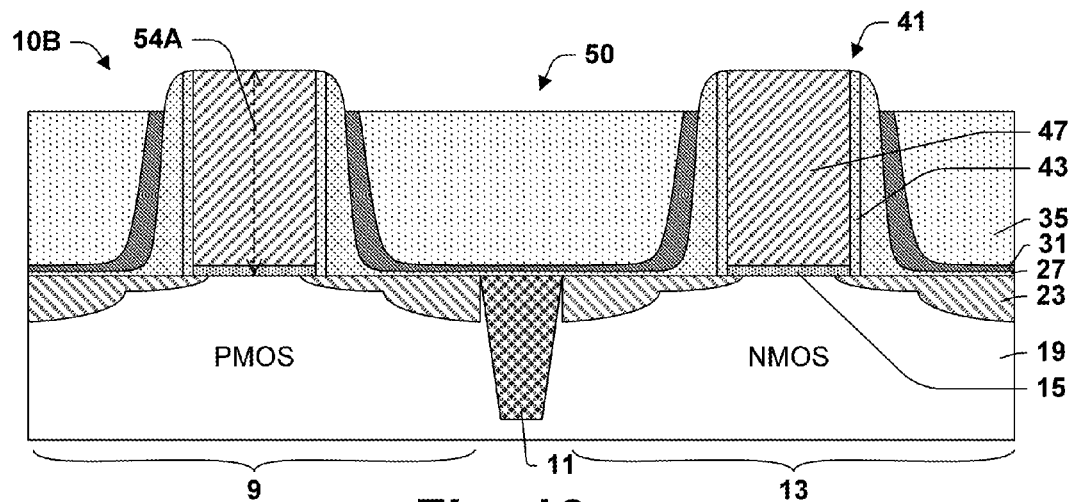
FIGS. 12-13 illustrate another integrated circuit device, an example according to a further embodiment of the present disclosure, as it undergoes manufacture by the process of FIG. 1.
Figure 13:
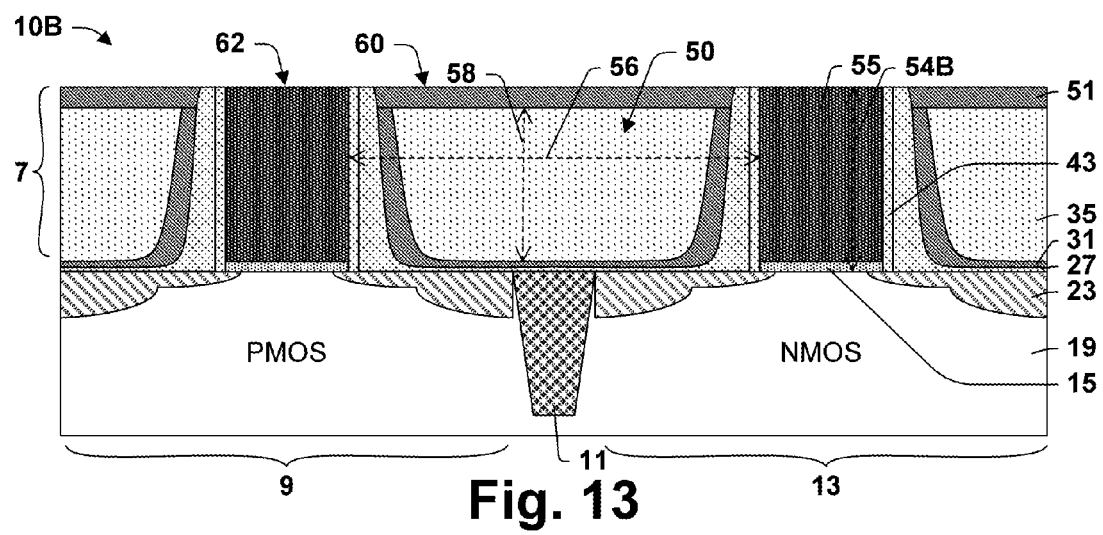

FIG. 1 provides a flow chart of a process 100 that is an example of one group of embodiments provided by the present disclosure. FIGS. 2-11 illustrate an integrated circuit device 10A, an example according to another embodiment of the present disclosure, as it undergoes manufacture by process 100. FIGS. 12-13 illustrate an integrated circuit device 10B, an example according to a further embodiment of the present disclosure, as it undergoes manufacture by process 100.

Process 100 begins with act 111, providing a substrate 19 with suitable doping and isolation regions 11, and a series of acts 112 that form spaced apart transistors on substrate 19. Acts 112 include act 115, forming a dummy gate stack, act 117, patterning the dummy gate stack to form dummy gates 41, and act 119, forming source/drain regions 23. The details of these acts can be broadly varied without departing from the scope of the present disclosure. These processes result in a structure as shown in FIG. 2.

Substrate 19 can be any suitable substrate that includes a semiconductor body. Possible substrates include, without limitation, silicon, silicon on insulator (SOI), Ge, SiC, GaAs, GaAlAs, InP, GaN, and SiGe. Isolation region 11 are generally shallow trench isolation (STI) regions but can also be isolation regions formed by local oxidation of silicon (LOCOS) or another suitable process. Substrate 19 can be doped in any suitable manner. In most embodiments substrate 19 is doped to provide p-MOS regions 9 and n-MOS regions 13.

Figure 2:
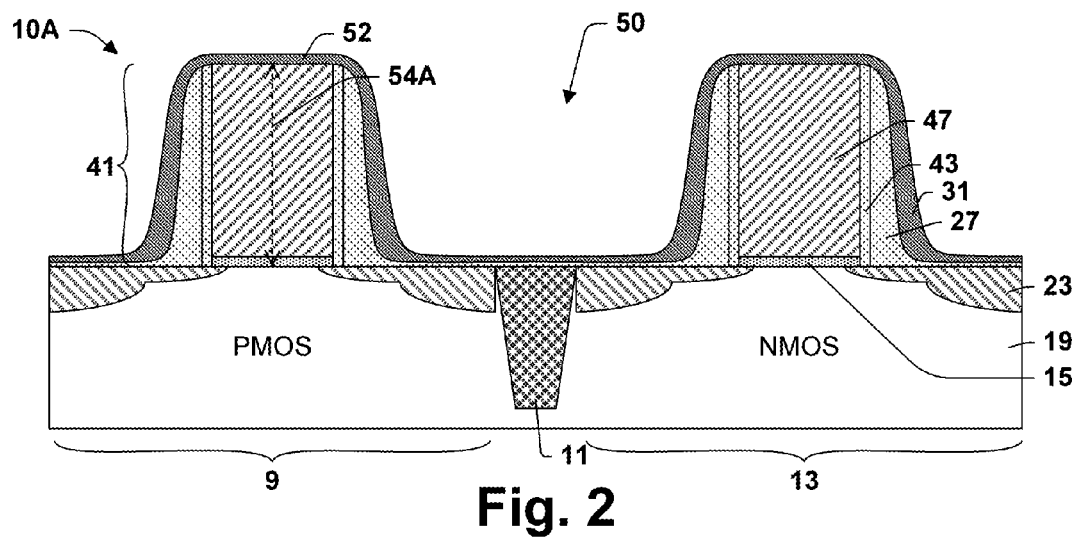
FIGS. 2-11 illustrate an integrated circuit device, an example according to another embodiment of the present disclosure, as it undergoes manufacture by the process of FIG. 1.

As shown in FIG. 2, dummy gates 41 include a high-k dielectric layer 15 and dummy gate electrodes 47. High-k dielectric layer 15 includes one or more layers of high-k dielectric material. In most embodiments, high-k dielectric layer 15 has a conductivity at least 5 times that of silicon dioxide. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples include, without limitation, $ZrO_2$, $Ta_2O_5$, $Al_2O_3$, $Y_2O_3$, $La_2O_3$, $SrTiO_3$, and combinations thereof. In most embodiments, high-k dielectric layer 15 has a thickness in the range from 5 Å to 50 Å.

Dummy gates 41 optionally include additional layers (not shown). For example, an interfacial layer may be provided or form spontaneously as a result of oxidation between high-k dielectric layer 15 and substrate 19. A capping layer may be formed between high-k dielectric layer 15 and dummy gate electrodes 47 to protect high-k dielectric layer 15 during the process of removing dummy gate electrodes 47 (act 149).

Dummy gate electrodes 47 are formed of a sacrificial layer, which can have any composition suited to that function. In most embodiments, dummy gate electrodes 47 are polysilicon. The thickness of dummy gate electrodes 47 is approximately the same as the initial gate height 54A. In typical embodiments, the initial gate height 54A is in the range from 800 Å to 1500 Å.

Act 119, forming source/drain regions 23, includes the formation of one or more sidewall spacers adjacent dummy gate electrodes 47. In most embodiments, these include at least oxide-based sidewall spacers 27 and nitride-based sidewall spacers 31 as illustrated in FIG. 2. FIG. 2 further illustrates a native oxide layer 43 that typically forms during act 117, patterning the dummy gate stack to form dummy gates 41. Sidewall spacers 27 and 31 can be used to control the distribution of dopants in forming source/drain regions 23. In most embodiments, source/drain regions 23 are salicided. Sidewall spacers 27 and 31 can also be used to control a saliciding process. As shown in FIG. 2, nitride-based sidewall spacers 31 form caps 52 on dummy gate electrodes 47.

In most embodiments, oxide-based sidewall spacers 27 are formed of a dielectric material having an etch susceptibility similar to $SiO_2$. For example, sidewall spacers 27 can be one or more layers of materials such as $SiO_2$ and SiOC.

In most embodiments, nitride-based sidewall spacers 31 are one or more layers of SiN or other dielectric materials having an etch susceptibility similar to SiN. In typical embodiments, caps 52 formed by nitride-based sidewall spacers 31 have a thickness in the range from 30 Å to 200 Å.

Figure 3:
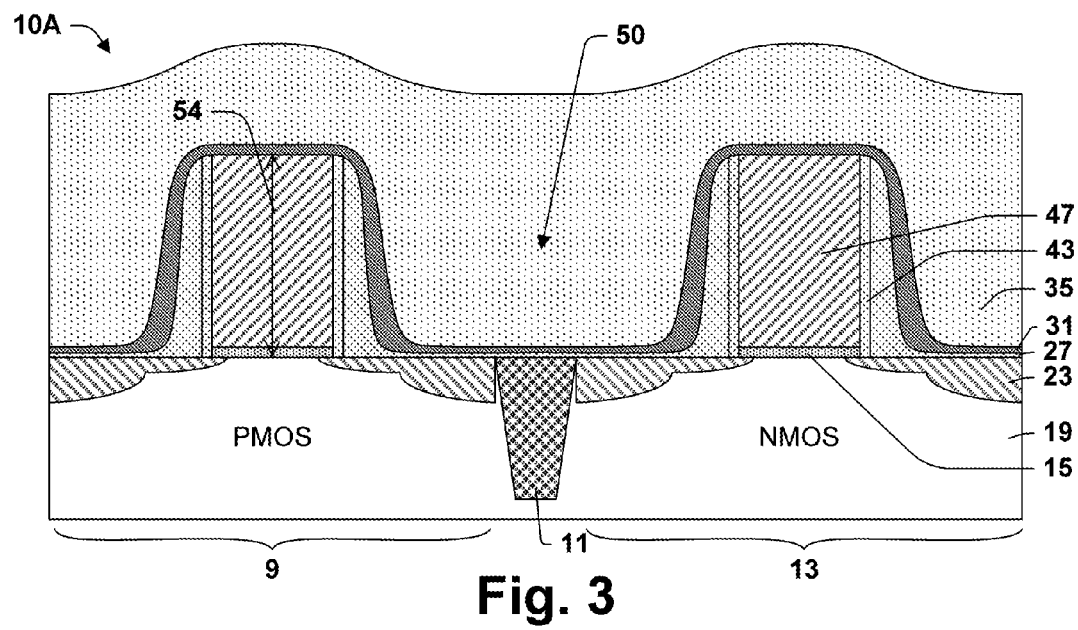

Process 100 continues with act 123, depositing $SiO_2$-based inter-level dielectric 35 as shown in FIG. 3. $SiO_2$-based inter-level dielectric 35 is deposited to fill and overflow spaces 50 between dummy gates 41. In most embodiments, $SiO_2$-based inter-level dielectric 35 is $SiO_2$. In typical embodiments, $SiO_2$-based inter-level dielectric 35 is deposited to a thickness in the range from 2000 Å to 5000 Å. Act 123 can form $SiO_2$-based inter-level dielectric 35 by any suitable process. A process with good gap-fill characteristics is generally selected. In some embodiments, $SiO_2$-based inter-level dielectric 35 is deposited using a flowable oxide precursor. In some embodiments, $SiO_2$-based inter-level dielectric 35 is deposited using a high density plasma (HDP) process. In some embodiments, $SiO_2$-based inter-level dielectric 35 is deposited using a high-aspect-ratio (HARP) process such as a sub-atmospheric CVD process using ozone with tetraethyl orthosilicate (TEOS).

Figure 4:
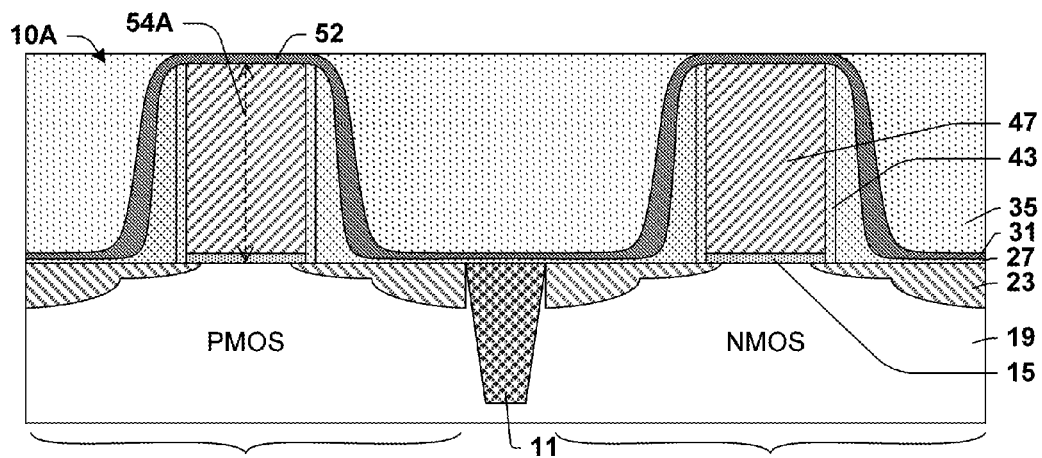

Act 127 is a chemical-mechanical polishing (CMP) process that polishes $SiO_2$-based inter-level dielectric 35 down to dummy gate electrode caps 52 as shown in FIG. 4. The CMP process of act 127 can be chosen to provide selectivity for removing the material of the $SiO_2$-based dielectric 35 over the material of nitride-based caps 52.

Figure 5:
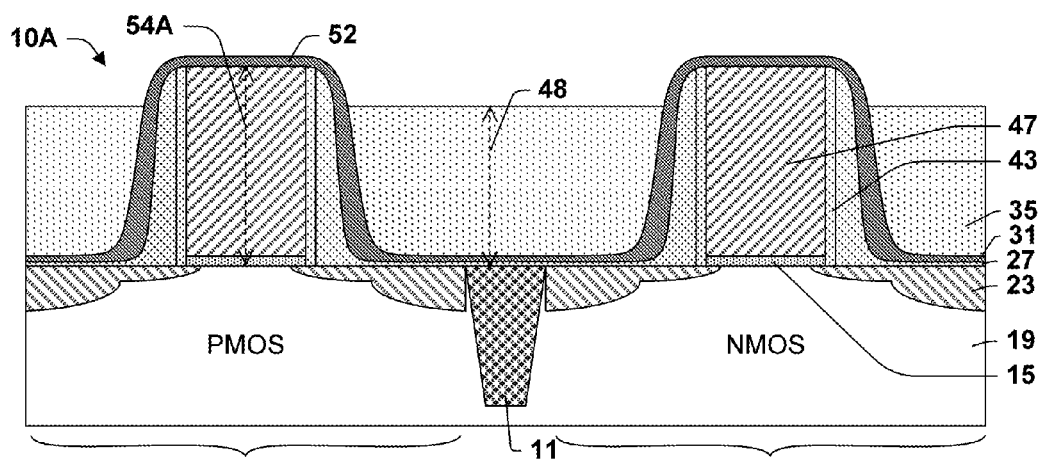

Act 131 is an etch process that recesses $SiO_2$-based inter-level dielectric 35 to below the initial height 54A of dummy gates 41 as shown in FIG. 5. In typical embodiments, act 131 etches $SiO_2$-based inter-level dielectric 35 until it is recessed from 150 Å to 500 Å below the initial height 54A of dummy gates 41. In typical embodiments, this leaves $SiO_2$-based inter-level dielectric 35 at a height 48 in the range from 300 Å to 1350 Å. The etch process of act 131 can be either a dry or a wet etch process and can be chosen to provide selectivity for removing the material of $SiO_2$-based dielectric 35 over the material of nitride-based sidewall spacers 31.

Act 135 is etching to remove all or part of the exposed portion of nitride-based sidewall spacers 31 as shown in FIG. 12. Act 135 is optional. If act 135 is included, the resulting structure is somewhat different. Accordingly, FIG. 12 identifies the device as 10B. Further processing of device 10B is essentially the same as for device 10A as show in FIGS. 6-11, on which the subsequent description focuses. The nitride-based sidewall spacer etch-back of process 135 is functional to widen spaces 50 between dummy gates 41 and can improve subsequent gap fill. In most embodiments, act 135 recesses nitride-based sidewall spacers 31 to approximately the height of $SiO_2$-based inter-level dielectric layer 35. Act 135 can use a dry etch with selectivity for removing nitride-based dielectrics over $SiO_2$-based dielectrics and polysilicon.

Figure 6:
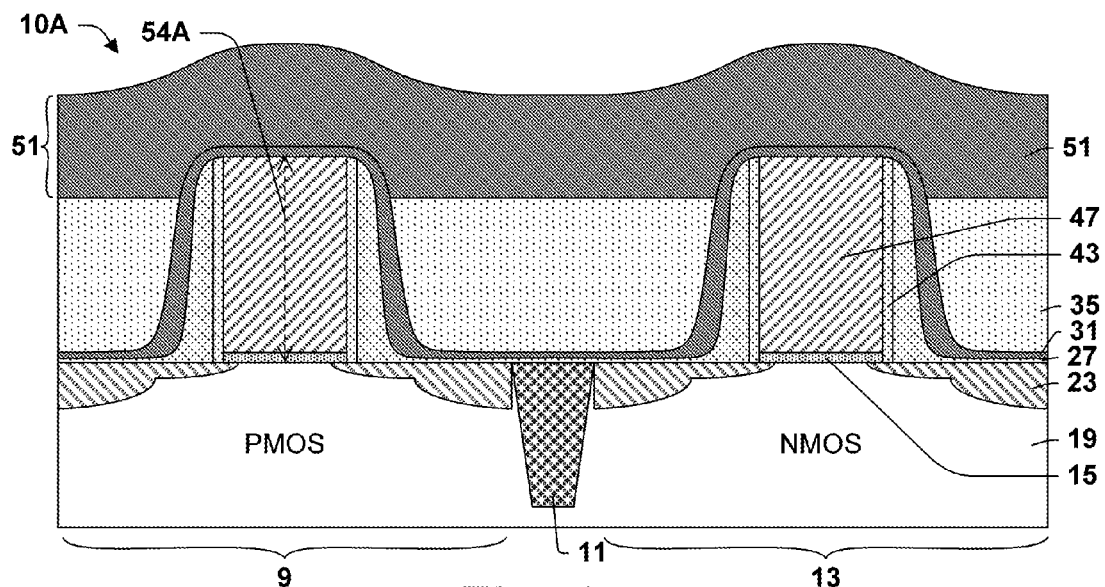

Act 141 is depositing inter-level dielectric capping layer 51 as shown in FIG. 6. Inter-level dielectric capping layer 51 can include one or more layers having any suitable composition. A suitable composition is one having a high etch resistance in comparison to $SiO_2$-based inter-level dielectric 35 for the etch used to remove dummy gate electrodes 47 in a subsequent process (act 149). There is generally a trade-off between etch resistance and dielectric constant, for which reason in most embodiments inter-level dielectric capping layer 51 has a higher dielectric constant than $SiO_2$-based inter-level dielectric 35. In typical embodiments, the composition of inter-level dielectric capping layer 51 is Si or SiO compounded with one or more of carbon, nitrogen, and boron. In typical embodiments, the composition is SiN, SiCN, SiB, SiOC, SiC, SiON, SiOCN, or a combination thereof. In some embodiments, the thickness of inter-level dielectric capping layer 51 is in the range from 500 Å to 1000 Å. Inter-level dielectric capping layer 51 can be deposited by any suitable process. Example of processes that can be suitable include atomic layer deposition (ALD), plasma-enhanced CVD (PE-CVD), high plasma density CVD (HPD-CVD) processes.

Figure 7:
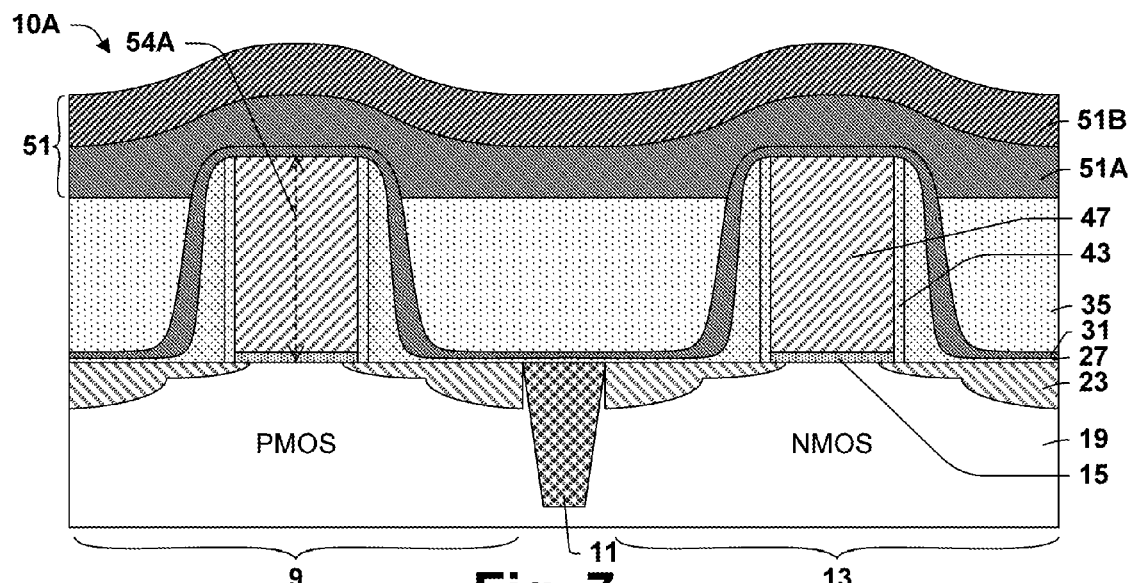

In some embodiments, inter-level dielectric capping layer 51 includes two or more layers. FIG. 7 provides an example in which inter-level dielectric capping layer 51 includes a first layer 51A and a second layer 51B. In most of these embodiments, the first layer 51A is formed by ALD, which provides good gap fill, The second layer 51B can then be deposited by a lower cost process, such as PE-CVD or HPD-CVD. In some embodiments, the thicknesses of inter-level dielectric capping layers 51A and 51B are each in the range from 250 Å to 500 Å.

Figure 8:
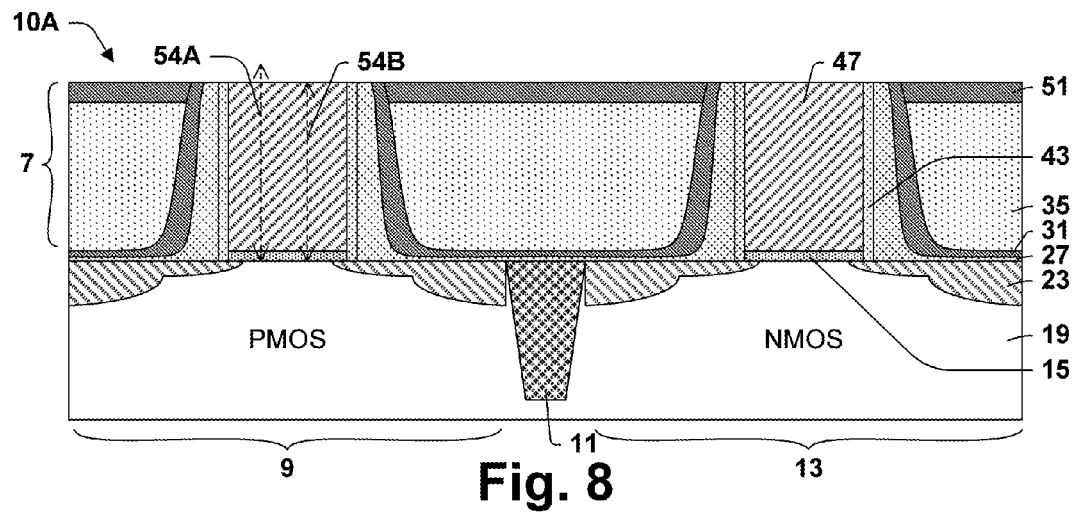

Process 100 continues with act 145, which is a CMP process to expose dummy gate electrodes 47 as shown in FIG. 8. The CMP process of act 145 can be chosen to provide selective removal of inter-level dielectric capping layer 51 over the material of dummy gate electrodes 47. In typical embodiments, the CMP process of act 145 reduces the initial height 54A of dummy gates 41 to height 54B. In some embodiments, dummy gate stack height 54A is reduced by 100 Å to 300 Å. In some embodiments, act 145 reduces dummy gate stack height 54A to a height 54B that is within the range from 600 Å to 1300 Å, which is a suitable gate height for many applications. In some embodiments, act 145 reduces dummy gate stack height 54A by 5% to 25%.

The CMP process of act 145 thins inter-level dielectric capping layer 51 without removing that layer entirely. Where inter-level dielectric capping layer 51 includes multiple layers as in the example of FIG. 7, the upper layer 51B may be removed entirely, but at least part of the lower layer 51A remains. In typical embodiments, the remaining portion of inter-level dielectric capping layer 51 has a thickness in the range from 70 Å to 300 Å, which generally provides sufficient thickness to provide the desired increase in etch resistance while not excessively increasing the overall dielectric constant of inter-level dielectric 7. In other terms, the inter-level dielectric capping layer 51 typically accounts for 5% to 40% of the total thickness of inter-level dielectric 7 following the CMP process of act 145.

Figure 9:
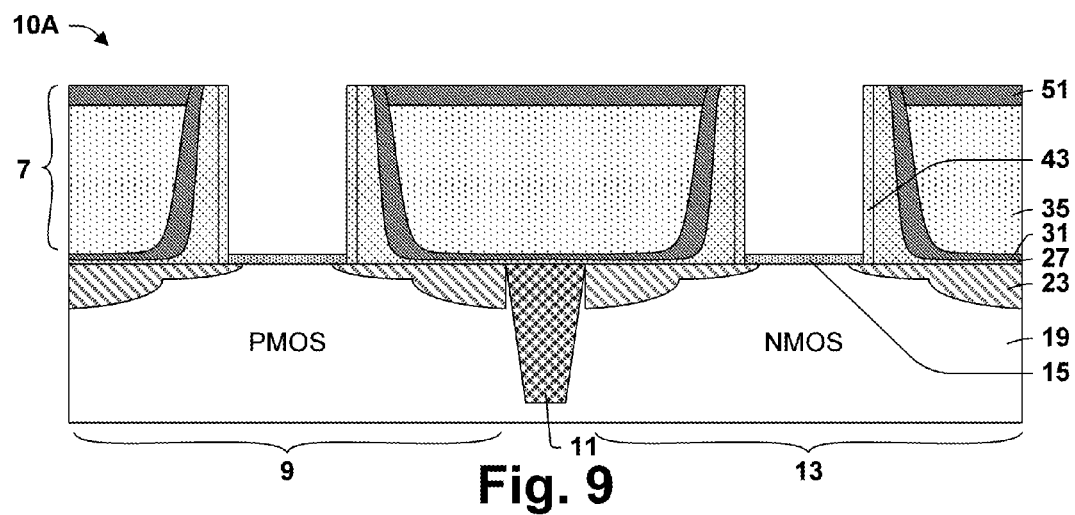

Process 100 continues with act 149, removing dummy gate electrodes 47 as shown in FIG. 9. Dummy gate electrodes 47 can be removed by any suitable process. In most embodiments, act 149 removes dummy gate electrodes 47 using a dry etch process. The etch process conditions can be selected to provide selectivity for the removing material of dummy gate electrodes 47 over the material of capping layer 51. In most embodiments, this selectivity is higher than the process's selectivity between the material of dummy gate electrodes 47 and the material of $SiO_2$-based inter-level dielectric 35. In some embodiments, the process of act 149 provides high selectivity for removing polysilicon over SiN. A typical process for act 149 is a plasma etch using a mixture of $CHF_3$, HBr, and $O_2$. Other typical conditions include a pressure in the range from 10 mT to 20 mT, source power in the range from 500-1000 W, and source bias in the range from 10-30 W.

Figure 10:
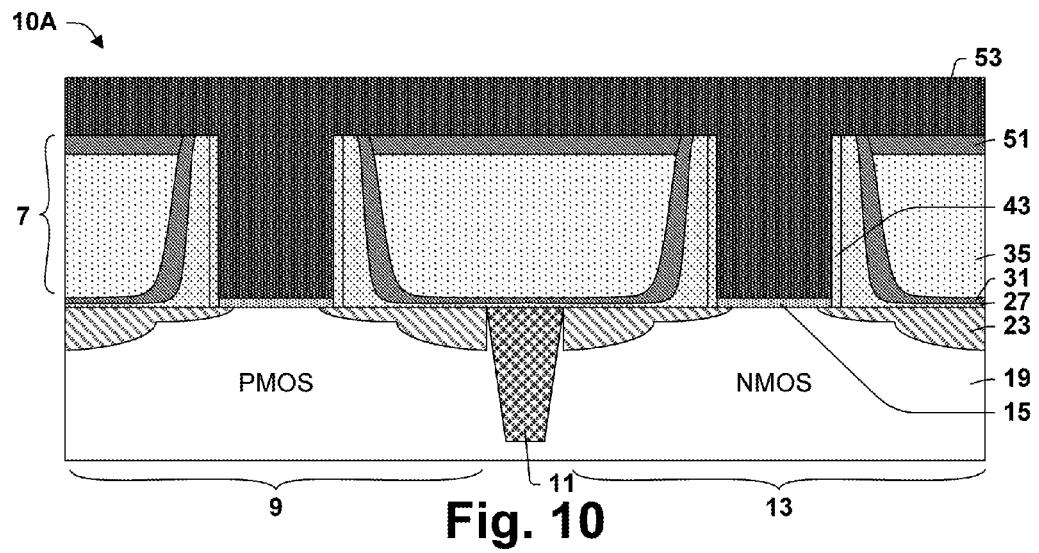

Act 153 deposits metal 53 to replace the dummy gate electrodes 47 as shown in FIG. 10. In some embodiments, metal 53 includes multiple layers of differing compositions. In some embodiments, the layers of metal 53 are different in p-MOS region 9 than in n-MOS region 13. A bottom layer can be a work function metal. Examples of work function metals include, without limitation, one or more layers of Ti, TiN, TaN, Ta, TaC, TaSiN, W, WN, MoN, and MoON. Additional metal layers can include one or more middle layers and a top layer. These additional layers can be of any suitable metals. Examples of metals that could be used include, without limitation, ruthenium, palladium, platinum, cobalt, nickel, hafnium, zirconium, titanium, tantalum, aluminum, and conductive carbides, oxides, and alloys of these metals. The metal layers may be formed by any suitable process or combination of processes. Physical vapor deposition (PVD) is a typical process. Examples of other metal layer formation process that can be used include electroplating, electroless plating, ALD, and CVD.

Figure 11:
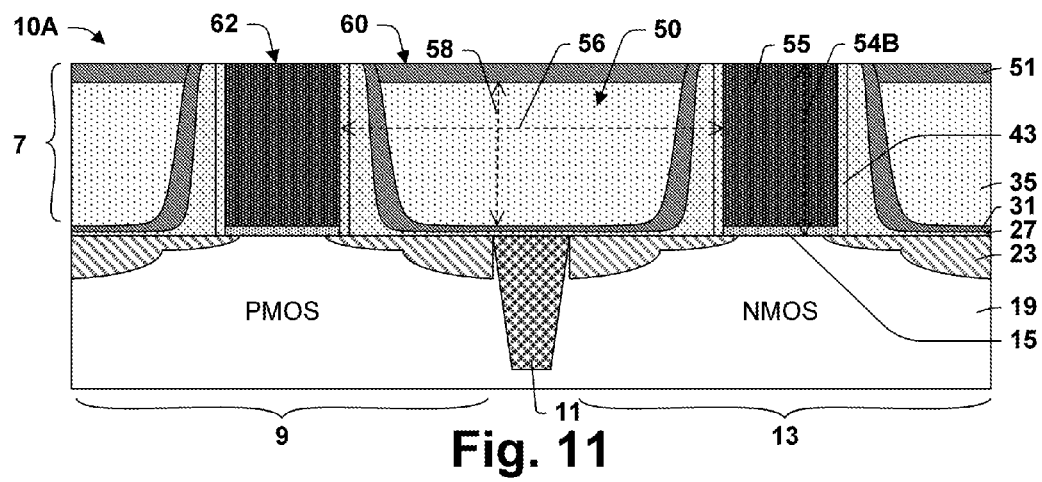

Process 100 continues with act 157, CMP to remove excess metal 53 from inter-level dielectric capping layer 51 and forms metal 53 into metal gate electrodes 55, which are spaced apart on substrate 19 as shown in FIG. 11. FIG. 13 shows the result for device 10B, which has been formed using the option SiN etch back process of act 135. The conditions for the CMP process of act 157 can be selected to remove metal 53 preferentially over the material of inter-level dielectric capping layer 51. In most embodiments, this selectivity is higher than the CMP process's selectivity between metal 53 and the material of $SiO_2$-based inter-level dielectric 35. Accordingly, inter-level dielectric capping layer 51 is useful to maintain gate height 54B through the electrode metal CMP process of act 157.

With reference to FIGS. 11 and 13, at the conclusion of process 157 an inter-level dielectric layer 7 is formed by a composite that includes $SiO_2$-based inter-level dielectric 35 and inter-level dielectric capping layer 51. Inter-level dielectric layer 7 fills the bulk of the widths 56 of the spaces 50 between metal gate electrodes 55. In most embodiments, $SiO_2$-based inter-level dielectric 35 makes up the bulk of inter-level dielectric layer 7 and largely determines the electrical properties of inter-level dielectric layer 7. While $SiO_2$-based inter-level dielectric 35 has a thickness 58 that is at least half the gate height 54B, it rises to substantially less than the height of metal gate electrodes 55. On the other hand, inter-level dielectric capping layer 51 rises to approximately the height of metal gate electrodes 55, whereby the upper surface 60 inter-level dielectric capping layer 51 is approximately coplanar with the tops 62 of metal gate electrodes 55.

Inter-level dielectric layer 7 and its subsidiary layers $SiO_2$-based inter-level dielectric 35 and inter-level dielectric capping layer 51 have cross-sectional areas that diminish with increasing height over substrate 19. This is a consequence of the shapes of oxide-based sidewall spacers 27 and nitride-based sidewall spacers 31 and the fact that inter-level dielectric layer 7 is formed after these spacers. In the case of device 10B nitride-based sidewall spacers 31 rise to the same height as $SiO_2$-based inter-level dielectric 35, whereby the tops of these structures are approximately co-planar.

The present disclosure provides an integrated circuit device that includes a plurality of transistors having metal gate electrodes of a height and spaced apart over a semiconductor body. A first dielectric structure, which includes one or more dielectric layers, spans the bulk of the width of the spaces between adjacent metal gate electrodes and has a thickness substantially equal to at least half the height of the metal gate electrodes, but rises to substantially less than the height of the gate electrodes. A second dielectric structure including one or more dielectric layers is formed over the first dielectric structure and rises to approximately the height of the metal gate electrodes. The uppermost portion of the first dielectric structure has a distinct composition from the lowermost portion of the second dielectric structure. The second dielectric structure is operative as a capping layer and helps to control gate height during manufacturing.

The present disclosure also provides an integrated circuit device that includes a semiconductor body, an inter-level dielectric formed at a gate level over the semiconductor body, and metal gate electrodes at the gate level. The inter-level dielectric comprises two dielectric layers having different compositions. The top of the uppermost layer of the inter-level dielectric is approximately coplanar with the tops of the metal gate electrodes. The uppermost layer is a capping layer having a higher resistance than an underlying layer of the inter-level dielectric to etch conditions for removing polysilicon dummy gate electrodes using etch gases comprising $CHF_3$, HBr, and $O_2$.

The present disclosure provides a method of forming an integrated circuit device that includes providing a semiconductor substrate, forming dummy gates over the semiconductor substrate, depositing a first dielectric layer over the dummy gates, chemical mechanical polishing to recede the first dielectric layer to the height of the dummy gates, etching to recess the first dielectric layer below the height of the gates, depositing one or more additional dielectric layers over the first dielectric layer, and chemical mechanical polishing to recede the one or more additional dielectric layers to the height of the gates.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
   a semiconductor body;
   a plurality of transistors over the semiconductor body, the transistors having metal gate electrodes of a height and spaced apart over the semiconductor body, and having a first set of sidewall spacers disposed along outer sidewalls of a metal gate electrode and a second set of sidewall spacers having vertical sections disposed along outer sidewalls of the first set of sidewall spacers, wherein the first set of sidewall spacers has a distinct composition from the second set of sidewall spacers;
   a first dielectric structure comprising one or more dielectric layers and spanning a bulk of a width of the spaces between adjacent metal gate electrodes and having a thickness substantially equal to at least half the height of the metal gate electrodes, but rising to substantially less than the height of the metal gate electrodes; and
   a second dielectric structure comprising one or more dielectric layers and formed over the first dielectric structure, rising to approximately the height of the metal gate electrodes, wherein substantially flat upper surfaces of the vertical sections are substantially coplanar with a lower surface of the second dielectric structure;

wherein an uppermost portion of the first dielectric structure has a distinct composition from a lowermost portion of the second dielectric structure; and wherein the second dielectric structure extends over an upper surface of the second set of sidewall spacers to directly contact an outer sidewall of the first set of sidewall spacers.

2. The integrated circuit device of claim 1, wherein the second dielectric structure has a higher resistance than the first dielectric structure to plasma etching with etch conditions suitable for removing polysilicon dummy gate electrodes using etch gases comprising $CHF_3$, HBr, and $O_2$.

3. The integrated circuit device of claim 1 wherein:
the first dielectric structure comprises silicon dioxide; and
the second dielectric structure comprises dielectrics selected from a group consisting of silicon nitride, silicon carbide, silicon oxynitride, silicon carbonitride, silicon boride, silicon carboboride, silicon oxycarbonitride, and mixtures thereof.

4. The integrated circuit device of claim 1, wherein both the first and second dielectric structures have cross-sectional areas that increase progressively with height.

5. The integrated circuit device of claim 1, wherein the first set of sidewall spacers has a height substantially equal to that of the second dielectric structure and wherein the second set of sidewall spacers has a height that is less than that of the second dielectric structure.

6. The integrated circuit device of claim 1, wherein:
the first dielectric structure has a thickness in a range from 600 Å to 1300 Å; and
the second dielectric structure has a thickness in a range from 70 Å to 300 Å.

7. The integrated circuit device of claim 6, wherein the first and second dielectric structures each consist of a single layer.

8. An integrated circuit device, comprising:
a semiconductor body;
an inter-level dielectric formed at a gate level over the semiconductor body, wherein the inter-level dielectric includes an uppermost layer and an underlying layer;
metal gate electrodes at the gate level;
a first set of oxide-based sidewall spacers disposed along outer sidewalls of a metal gate electrode; and
a second set of nitride-based sidewall spacers disposed along outer sidewalls of the first set of oxide-based sidewall spacers;
wherein a top of the uppermost layer of the inter-level dielectric is approximately coplanar with the tops of the metal gate electrodes; and
wherein a bottom of the uppermost layer of the inter-level dielectric is substantially coplanar with and extends over a substantially flat upper surface of the second set of nitride-based sidewall spacers to directly contact the outer sidewalls of the first set of oxide-based sidewall spacers.

9. The integrated circuit device of claim 8, wherein:
the underlying layer is $SiO_2$; and
the uppermost layer is Si or SiO compounded with one or more of carbon, nitrogen, or boron.

10. The integrated circuit device of claim 8, wherein the uppermost layer has a slightly greater area than the underlying layer.

11. The integrated circuit device of claim 8, wherein:
the metal gate electrodes have a height; and
the uppermost layer has a thickness in a range from 5% to 40% of the height.

12. The integrated circuit device of claim 11, wherein the underlying layer has a thickness that is in a range from 60% to 95% of the height.

13. The integrated circuit device of claim 8, wherein the underlying layer has a lower dielectric constant than the uppermost layer.

14. An integrated circuit device comprising:
one or more gate electrodes disposed over an upper surface of a semiconductor substrate, the one or more gate electrodes having a first height;
a first sidewall spacer disposed along outer sidewalls of the one or more gate electrodes;
a second sidewall spacer having lateral and vertical sections, wherein the vertical sections are disposed along outer sidewalls of the first sidewall spacer and the lateral sections extend over the upper surface of the semiconductor substrate, and wherein the second sidewall spacer is nitride based;
a first dielectric structure disposed over the lateral sections of the second sidewall spacer and laterally separating the one or more gate electrodes; and
a second dielectric structure disposed directly over the first dielectric structure, wherein an upper region of the first dielectric structure and a lower region of the second dielectric structure share an interface and have different chemical compositions;
wherein the second dielectric structure extends over a substantially flat upper surface of the vertical sections of the second sidewall spacer and directly contacts an outer sidewall of the first sidewall spacer, and wherein the substantially flat upper surface of the vertical sections is substantially coplanar with a lower surface of the second dielectric structure.

15. The integrated circuit device of claim 14, wherein upper surfaces of the one or more gate electrodes are coplanar with an upper surface of the second dielectric structure.

16. The integrated circuit device of claim 14, wherein, the first sidewall spacer includes lateral extensions that extend below the lateral sections of the second sidewall spacer.

17. The integrated circuit device of claim 14, wherein,
a height of the first dielectric structure is less than the first height and is greater than half the first height.

18. The integrated circuit device of claim 14, wherein:
the first dielectric structure and the first sidewall spacer comprise silicon dioxide; and
the second dielectric structure comprises silicon nitride, silicon carbide, silicon oxynitride, silicon carbonitride, silicon boride, silicon carboboride, silicon oxycarbonitride, or mixtures thereof.

19. The integrated circuit device of claim 14, wherein:
the second sidewall spacer has rounded corners along regions where the lateral and vertical sections merge; and
a lower surface of the first dielectric structure follows a contour of the rounded corners.

* * * * *